United States Patent [19]

Anagnostopoulos

[11] Patent Number: 5,563,404
[45] Date of Patent: Oct. 8, 1996

[54] FULL FRAME CCD IMAGE SENSOR WITH ALTERED ACCUMULATION POTENTIAL

[75] Inventor: Constantine N. Anagnostopoulos, Mendon, N.Y.

[73] Assignee: Eastman Kodak Company, Rochester, N.Y.

[21] Appl. No.: 408,859

[22] Filed: Mar. 22, 1995

[51] Int. Cl.⁶ ................................. H01L 29/765
[52] U.S. Cl. .................. 250/208.1; 257/225; 348/311
[58] Field of Search .................. 250/208.1; 348/294, 348/296, 297, 298, 311, 312, 317, 319, 320, 321, 322, 323; 257/222, 225, 241, 242, 431, 443

[56] References Cited

U.S. PATENT DOCUMENTS

| | | | |
|---|---|---|---|
| 3,402,081 | 9/1968 | Lehman | 148/188 |
| 3,895,966 | 7/1975 | MacDougall et al. | 148/1.5 |
| 3,912,545 | 10/1975 | Armstrong | 148/1.5 |
| 4,503,450 | 3/1985 | Brewer | 357/24 |
| 4,613,402 | 9/1986 | Losee et al. | 156/643 |
| 4,808,834 | 2/1989 | Kimata | 250/578 |
| 4,997,784 | 3/1991 | Thenoz et al. | 437/53 |
| 5,086,342 | 2/1992 | Spies et al. | 358/213 |
| 5,241,198 | 8/1993 | Okada et al. | 257/215 |
| 5,262,661 | 11/1993 | Kuroda et al. | 257/227 |
| 5,324,968 | 6/1994 | Ciccarelli et al. | 257/222 |

*Primary Examiner*—Edward P. Westin
*Assistant Examiner*—John R. Lee
*Attorney, Agent, or Firm*—James D. Leimbach

[57] ABSTRACT

In accordance with the invention, a full frame solid-state image sensor with altered accumulation potential comprises a substrate that includes a semiconductor of one conductivity type and has a surface at which is situated a photodetector that comprises a first storage area and a second storage area. The first and second storage areas each comprise a CCD channel of conductivity type opposite to the conductivity type of the semiconductor, and the channel comprises an uppermost region of opposite conductivity type to the remainder of the CCD channel. A first barrier region separates the first storage area from the second storage area, and a second barrier region separates the second storage area from an adjacent photodetector; the second barrier region is shallower than the first barrier region. Adjacent to one side of the photodetector is a channel stop of the same conductivity type as the semiconductor. A first and a second gate each comprising a conductive layer overlie the CCD channel, and a dielectric is interposed between the conductive layer and the CCD channel. In the method of the invention, the uppermost region of the CCD channel is doped with a dopant of conductivity opposite to the conductivity of the CCD channel, thereby lowering the accumulation potential.

20 Claims, 3 Drawing Sheets

FULL FRAME CCD IMAGE SENSOR WITH ALTERED ACCUMULATION POTENTIAL

FIELD OF THE INVENTION

The present invention relates to a charge-coupled device (CCD) solid-state image sensor, and more particularly to a full frame CCD sensor having an altered accumulation potential and a method for altering accumulation potential in a CCD sensor.

BACKGROUND OF THE INVENTION

Solid-state image sensors in general comprise photodetector means for detecting radiation from an image and converting the radiation to charge carriers, and transfer means for carrying the charge carriers to an output circuit. In one type of solid-state image sensor, an interline area sensor, the CCD imager includes a plurality of photodetectors, or pixels, disposed in an array of rows and columns, with CCD shift registers arranged between the rows of the photodetectors. The photodetectors in each row are coupled by transfer gates to their adjacent CCD shift registers so that the charge carriers accumulated in the photodetectors can periodically be transferred to the CCD shift registers. In another type of sensor, a full frame sensor, a charge-coupled device (CCD) is employed as both photodetector and transfer means. A single CCD shift register at the bottom of the sensor transfers the charge carriers to an on-chip amplifier for read-out. Full frame sensors require a mechanical shutter.

In a full frame CCD sensor, a pixel typically comprises two phases, each phase being provided with a gate and each including a storage region and a barrier region. The minimum gate voltage typically required to be applied in the vertical clocks to cause majority carrier (hole) accumulation at the $Si/SiO_2$ interface in the storage regions of the pixels is between −6.5 and −7.5 volts; this voltage is referred to as the accumulation potential. Application of the accumulation potential to the gates of the sensor suppresses the dark current generated at the semiconductor-dielectric interface. Vertical clock voltages are generally set to operate between −8 and +0.5 volts, this latter voltage being briefly applied to transfer charges between phases. Generation of a −8 volt clock voltage requires a −15 volt power supply.

PROBLEM TO BE SOLVED BY THE INVENTION

In a camera system, power supplies capable of providing −5 and +5 volts are required for the operation of the video amplifier. To simplify the power supply requirements, thereby reducing the cost of manufacturing a camera system, it would be highly desirable if the accumulation potential could be lowered to less than −5 volts. The imager vertical clocks could then be operated by the same power supplies employed for the video amplifier operation, the −15 volt supply could be eliminated, and the power consumption of the camera could be reduced.

SUMMARY OF THE INVENTION

In accordance with the invention, a full frame solid-state image sensor of altered accumulation potential comprises a substrate that includes a semiconductor of one conductivity type and has a surface at which is situated a photodetector that comprises a first storage area and a second storage area. The first and second storage areas each comprise a CCD channel of conductivity type opposite to the conductivity type of the semiconductor, and the channel comprises an uppermost region of opposite conductivity type to the remainder of the CCD channel. A first barrier region separates the first storage area from the second storage area, and a second barrier region separates the second storage area from an adjacent photodetector; the second barrier region is shallower than the first barrier region. Adjacent to one side of the photodetector is a channel stop of the same conductivity type as the semiconductor. A first and a second gate each comprising a conductive layer overlie the CCD channel, and a dielectric is interposed between the conductive layer and the CCD channel.

Also in accordance with the invention, a method for forming a full frame solid-state image sensor with altered accumulation potential comprises doping a substrate with a first dopant to form a semiconductor and doping a portion in the surface of the substrate with a second dopant of opposite conductivity to the first dopant to form a CCD channel opposite in conductivity to the semiconductor. For a given gate dielectric, the accumulation potential of the CCD channel is determined by the difference in concentrations of the first and second dopants. An uppermost region of the CCD channel is doped with a third dopant of opposite conductivity to the second dopant, thereby altering the accumulation potential.

ADVANTAGEOUS EFFECT OF THE INVENTION

The present invention provides for the altering of the accumulation potential in a full frame image sensor to about −4 volts, thereby enabling the construction of a camera system that utilizes +5 and −5 volt power supplies to operate both the vertical clocks and the video amplifier.

DETAILED DESCRIPTION OF THE INVENTION

Figure 1:
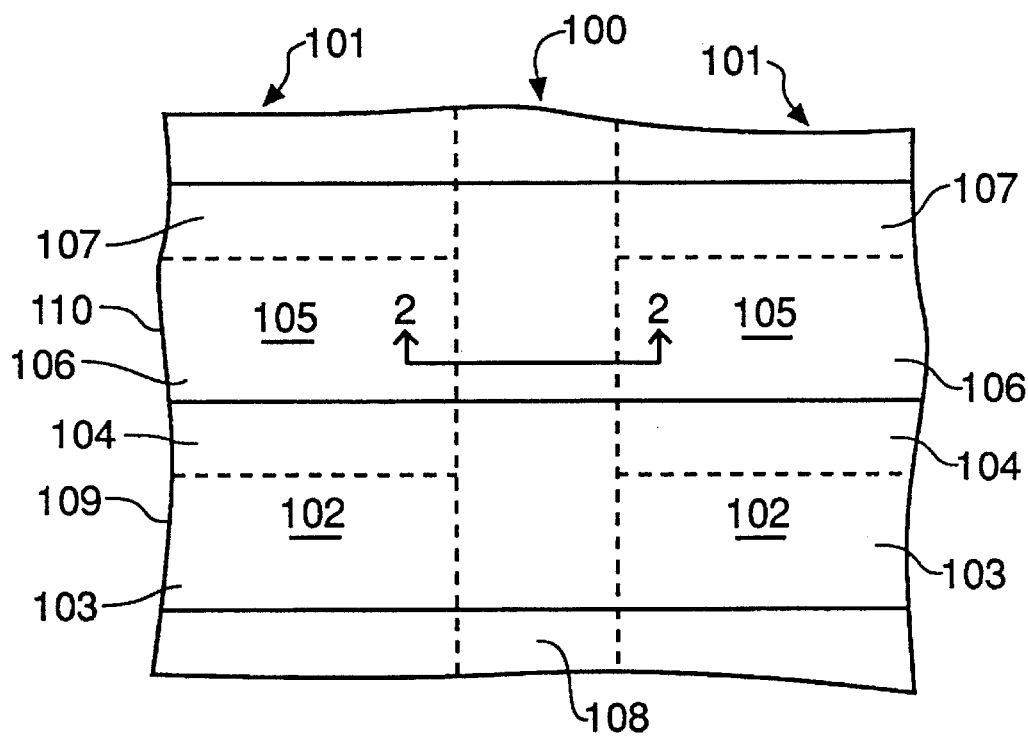
FIG. 1 is a top plan view of a portion of a solid-state image sensor of the present invention.
Figure 2:
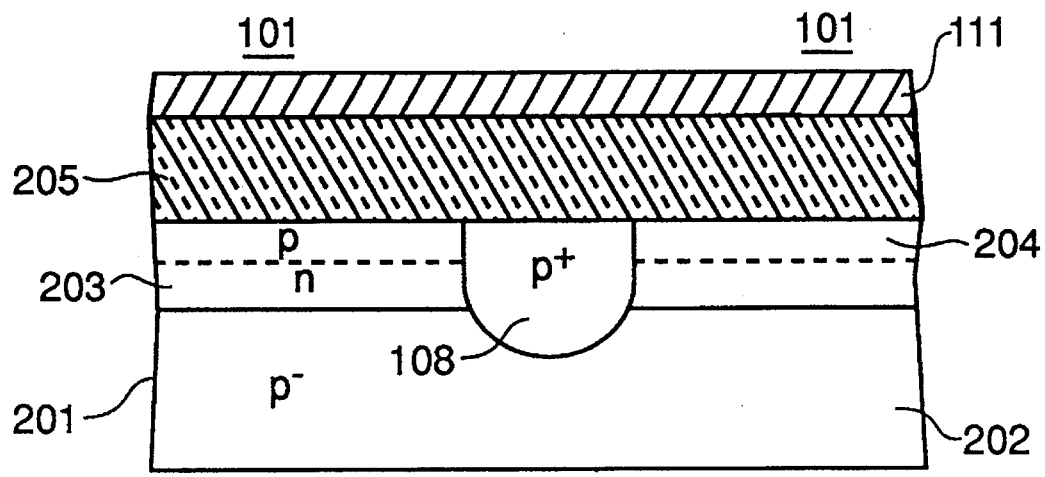
FIG. 2 is a sectional view along line 2—2 in FIG. 1 of a portion of an image sensor of the invention.

Referring to FIGS. 1 and 2, there is shown a schematic representation of a solid-state image sensor 100 that is an embodiment of the present invention. The image sensor 100 can comprise any number of CCD photodetectors 101, which are arranged in a spaced parallel relation. Each photodetector, or pixel, comprises two phases, a first pixel phase 102, which includes a first storage area 103 and a first barrier region 104, and a second pixel phase 105, which includes a second storage area 106 and a second barrier region 107. The barrier region 107, which separates the second storage area of the pixel from the first phase of an adjacent pixel, is shallower than the barrier region 104, which lies between the first and second storage areas of the pixel. A channel stop 108 adjacent to both phases of the pixel extends the length of the pixel.

A first set of parallel conductive gates 109, spaced apart over the first pixel phase 102 of the CCD channels 203, extends laterally across the CCD channels of all the photodetectors 101. A second set of parallel conductive gates 110, each of which is positioned between two of the first set of gates 109, also extends laterally across the CCD channels 203 of all the photodetectors 101 and are positioned over the second pixel phase 105 of the channels. These gates may be formed of a layer of conductive transparent material such as indium tin oxide or doped polycrystalline silicon.

Each photodetector 101 of image sensor 100 comprises a substrate 201 whose bulk portion comprises a semiconductor 202 of one conductivity type, shown in FIG. 2 as p-type. The semiconductor material may be, for example, monocrystalline silicon. The p-type substrate is doped with boron at a concentration of about 0.5 to $2.5 \times 10^{15}$ impurities/cm$^3$. The conductivity of the substrate is represented as p$^-$ in FIG. 2. At one surface of the substrate 202 and included within both storage areas of each pixel is a CCD channel 203 of conductivity type, in this case n-type, opposite to the conductivity type of the semiconductor. The n-type CCD channel may be formed by ion implantation of dopant impurities such as arsenic or phosphorus into the surface of the substrate at a dose of 1 to $5 \times 10^{12}$/cm$^2$ and an energy of 50–400 KeV. The negative impurities in the CCD channel are represented as n in FIG. 2.

In accordance with the invention, the CCD channel 203 comprises an uppermost region 204 that includes a shallow implant of a p-type dopant such as boron; the conductivity of this uppermost region is represented as p in FIG. 2. The p-dopant is implanted in region 204 at a dose of 1 to 5 $10^{12}$/cm$^2$ and an energy of 12–18 KeV. Alternatively, the counter doping may be accomplished by diffusing a dopant into the uppermost region 204.

Figure 3:
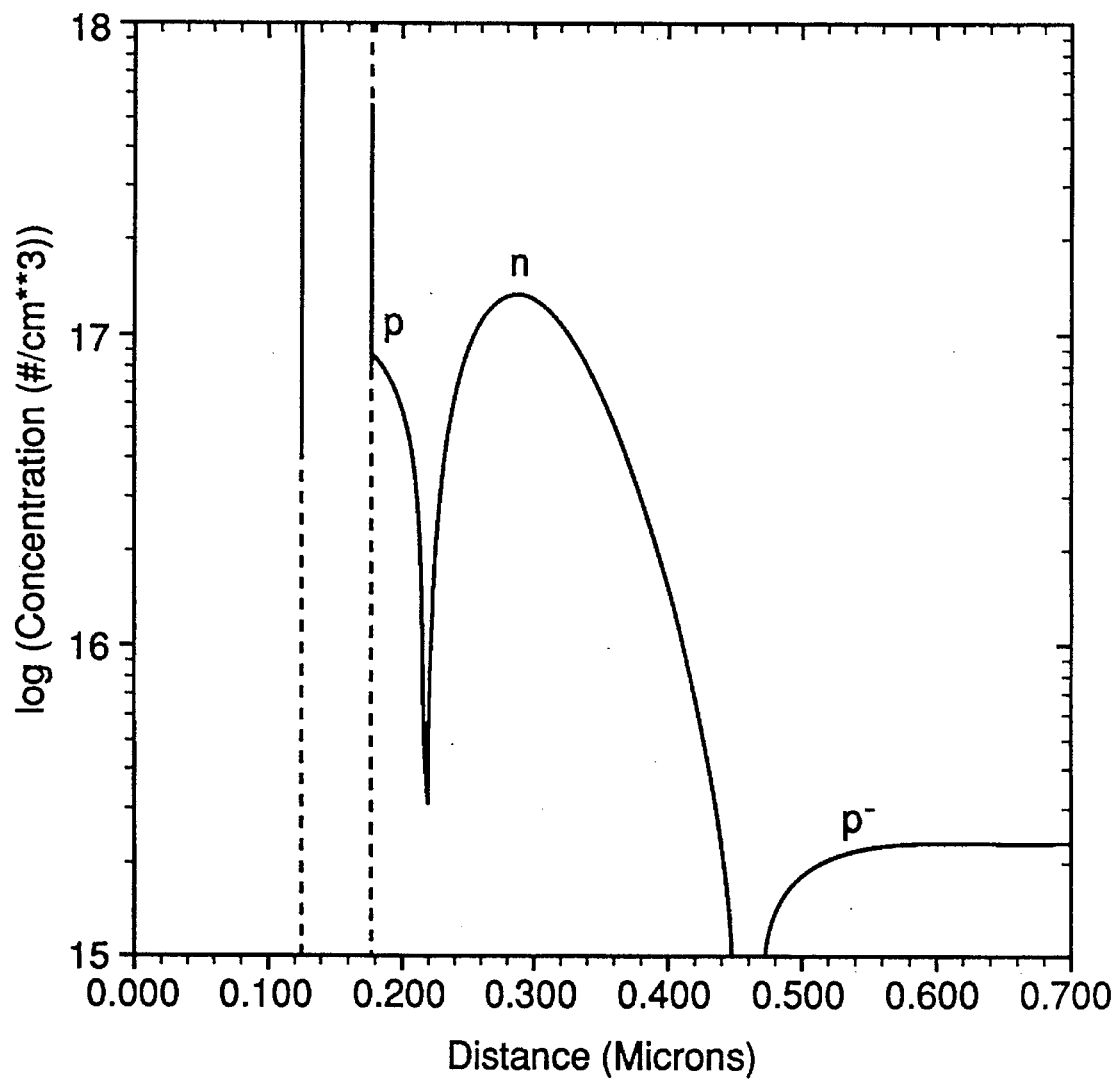
FIG. 3 is a plot showing the net impurity concentration in a storage area of a pixel.

FIG. 3 depicts a profile of the calculated net impurity concentration in the first storage area of a photodetector in a sensor of the present invention. The semiconductor was formed by boron doping during crystal growth (p$^-$-region), and the CCD channel (n-region) was formed by implantation of arsenic at a dose of $2.9 \times 10^{12}$/cm$^2$ and an accelerating voltage of 270 KeV. This was followed by shallow implantation of boron in the uppermost region of the CCD channel (p-region) at a dose of $2.8 \times 10^{12}$/cm$^2$ and an energy of 15 KeV.

Interposed between the CCD channels 203 and both sets of conductive gates 109 and 110 is a dielectric 205. This dielectric layer is typically silicon dioxide, which may be formed either by chemical vapor deposition of the oxide or by thermal oxidation of silicon. The thickness of this layer is typically about 500 angstroms.

The channel stop 108 is highly conductive and of the same conductivity type as the semiconductor 202; the conductivity of the channel stop, which extends from the substrate surface through the CCD channel 203 and into the p-type semiconductor is represented as p$^+$ in FIG. 2. Its impurities surface concentration is typically higher than $10^{17}$/cm$^3$.

Methods for making CCD photodetectors are described in U.S. Pat. No. 4,613,402, the disclosures of which are incorporated herein by reference. In accordance with the present invention, the image sensors may include antiblooming structures, as described in U.S. Pat. Nos. 4,975,777, 5,130,774, and 5,349,215, the disclosures of which are incorporated herein by reference.

Radiation from an image is detected by a photodetector and converted to charge carriers in both pixel phases while a potential, typically about −8 volts in the prior art, is applied to both gate 109 and gate 110. Then, while the voltage of gate 110 remains at −8 volts, a positive voltage, typically about +0.5 volt, is applied to gate 109. The resulting increase in channel potential causes charge carriers in phase 2 to flow into phase 1 and add to the charge already present there. Then the voltages at both gates are reversed; −8 volts is applied to gate 109, +0.5 volt to gate 110. This causes the charge accumulated in phase 1 to be transferred to phase 2 of the next pixel. A voltage of −8 volts is subsequently applied to gate 110, and the process is repeated. By clocking the voltages back and forth between the two sets of gates sequentially in this manner, the charge carriers are moved along the pixels to an output circuit, not shown, at the end of the sensor.

As previously discussed, because the minimum gate voltage typically required in the prior art to cause majority carrier accumulation in the pixel storage areas is about −6.5 to −7.5 volts, a vertical clock voltage of −8 volts is generally applied to the gates in the operation of the sensor. However, in accordance with the invention, introduction of a limited concentration of counter dopant results in sufficient lowering, by 3–4 volts, of the accumulation potential and allows the use of a power supply of lower voltage.

Figure 4:
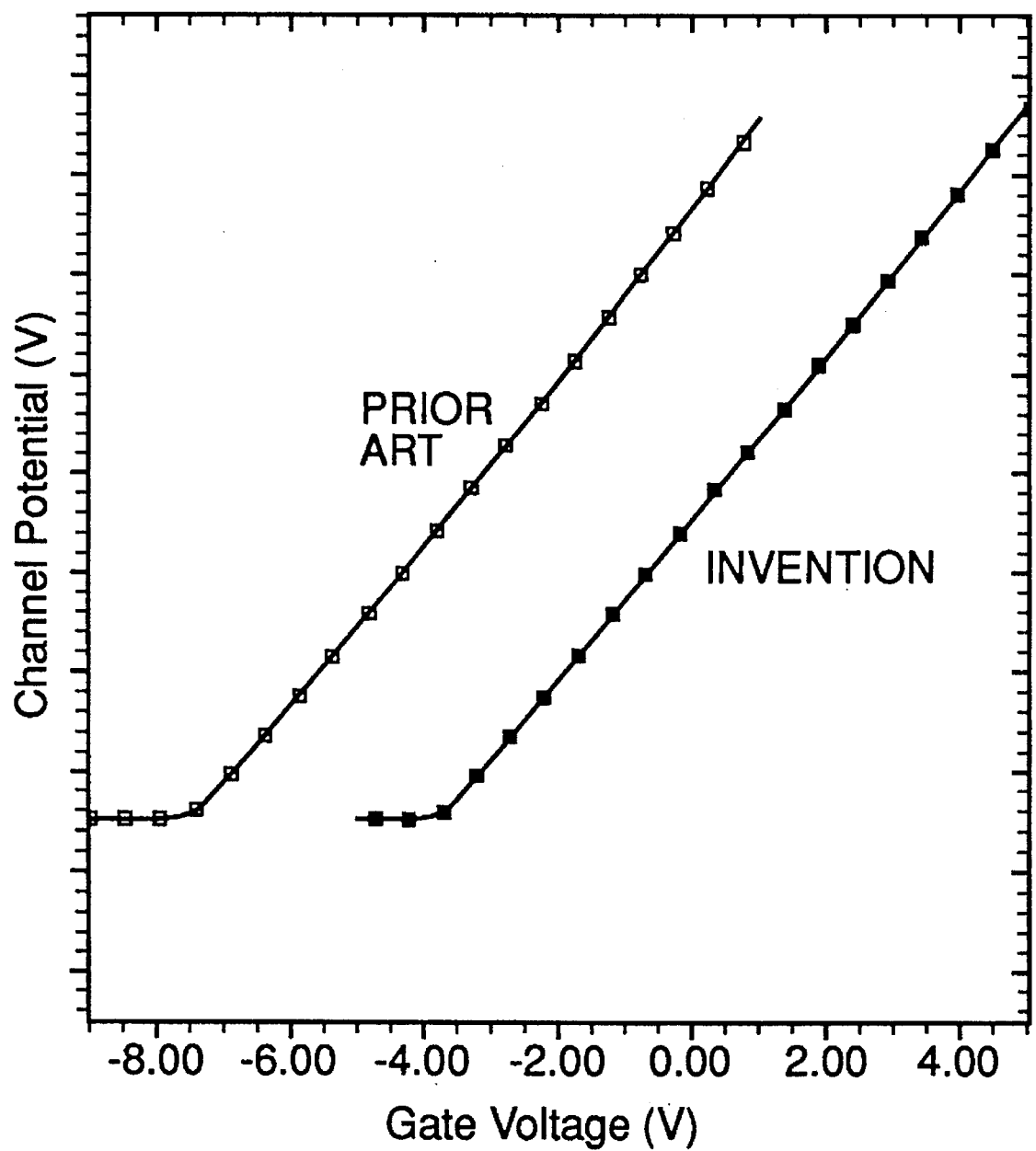
FIG. 4 is a plot of channel potential versus applied gate voltage.

FIG. 4 is a plot of channel potential versus applied gate voltage for a typical sensor formed in accordance with the prior art compared with a sensor formed by the method of the present invention. The accumulation potential, that value of the gate voltage at which the channel potential becomes invariant with increased gate voltage, is represented by the points at which each of the curves in FIG. 4 become flat. As shown in FIG. 4, the plot for the sensor treated by the method of the present invention shows a value for the accumulation potential of about −4.0 volts, compared to a corresponding value of about −7.5 volts for the prior art sensor. In effect, the plot of channel potential versus applied gate voltage has been laterally displaced by about 3.5 volts in the positive direction by application of the present invention.

The invention has been described in detail with particular reference to certain preferred embodiments thereof, but it will be understood that variations and modifications can be effected within the spirit and scope of the invention.

PARTS LIST 100 image sensor
101 photodetector
102 first pixel phase
103 first storage area
104 first barrier region
105 second pixel phase
106 second storage area
107 second barrier region
108 channel stop
109 first conductive gate
110 second conductive gate
201 substrate
202 semiconductor
203 CCD channel
204 uppermost region of CCD channel
205 dielectric

What is claimed is:

1. A full frame solid-state image sensor with altered accumulation potential, comprising:

(a) a substrate comprising a semiconductor of one conductivity type and having a surface;

(b) at least one photodetector at said surface of said substrate, said photodetector comprising a first storage area and a second storage area, said first storage area and said second storage area each comprising a CCD channel having a first surface and a second surface, said first surface being adjacent said semiconductor surface and having a first region of conductivity type opposite to conductivity type of said semiconductor, said second surface being juxtapositioned away from said semiconductor surface and comprising a second region near the second surface being of opposite conductivity type to said first region;

(c) a first barrier region between said first storage area and said second storage area;

(d) a second barrier region between said second storage area and an adjacent photodetector wherein said second barrier region is shallower than said first barrier region;

(e) a channel stop of the same conductivity type as said semiconductor adjacent to one side of said photodetector;

(f) a first gate and a second gate each comprising a conductive layer overlying said CCD channel; and (g) a dielectric interposed between said conductive layer and said CCD channel.

2. An image sensor of claim 1 wherein said substrate comprises monocrystalline silicon and said semiconductor comprises a p-type dopant and said CCD channel comprises an n-type dopant.

3. An image sensor of claim 2 wherein said n-type dopant in said CCD channel comprises arsenic or phosphorus.

4. An image sensor of claim 2 wherein said uppermost region of said CCD channel further comprises a p-type dopant.

5. An image sensor of claim 4 wherein said p-type dopant in said semiconductor and in said uppermost region of said CCD channel comprises boron.

6. An image sensor of claim 3 wherein said n-type dopant in said CCD channel comprises arsenic implanted in said CCD channel at a dose of 1 to $5 \times 10^{12}/cm^2$ and an energy of 50–400 KeV.

7. An image sensor of claim 6 wherein said dose is about $2.9 \times 10^{12}/cm^2$ and said energy is 270 KeV.

8. An image sensor of claim 5 wherein said boron is implanted in said uppermost region of said CCD channel at a dose of 1 to $5 \times 10^{12}/cm^2$ and an energy of 12–18 KeV.

9. An image sensor of claim 8 wherein said dose is about $2.8 \times 10^{12}/cm^2$ and said energy is 15 KeV.

10. An image sensor of claim 1 wherein said accumulation potential is about −4 volts.

11. A method for forming a full frame solid-state image sensor with altered accumulation potential, comprising the steps of:

(a) doping a substrate having a surface with a first dopant having a first conductivity, thereby forming a semiconductor of a first conductivity;

(b) doping a portion in said surface in said substrate with a second dopant of opposite conductivity to said first dopant, thereby forming a CCD channel having an accumulation potential determined by the difference in concentrations of said first dopant in said semiconductor and said second dopant in said CCD channel;

(c) doping an uppermost region of said CCD channel with a third dopant of opposite conductivity to said second dopant, thereby altering said accumulation potential.

12. A method of claim 11 wherein said substrate comprises monocrystalline silicon and said semiconductor comprises a p-type first dopant and said CCD channel comprises an n-type second dopant.

13. A method of claim 12 wherein said n-type second dopant in said CCD channel comprises arsenic or phosphorus.

14. A method of claim 12 wherein said uppermost region of said CCD channel further comprises a p-type third dopant.

15. A method of claim 14 wherein said p-type first dopant in said semiconductor and p-type third dopant in said uppermost region of said CCD channel comprises boron.

16. A method of claim 13 wherein said n-type dopant in said CCD channel comprises arsenic implanted in said CCD channel at a dose of 1 to $5 \times 10^{12}/cm^2$ and an energy of 50–400 keg.

17. A method of claim 15 wherein said boron is implanted in said uppermost region of said CCD channel at a dose of 1 to $5 \times 10^{12}/cm^2$ and an energy of 12–18 KeV.

18. A method of claim 11 wherein said second dopant is arsenic implanted at a dose of about $2.9 \times 10^{12}/cm^2$ and an energy of 270 KeV and said third dopant is boron implanted at a dose of about $2.8 \times 10^{12}/cm^2$ and an energy of 15 KeV.

19. A method of claim 18 wherein said accumulation potential is about −4 volts.

20. A method of claim 11 wherein said third dopant is diffused into said uppermost region of said CCD channel.

* * * * *